(12) United States Patent
Mazzola et al.

(10) Patent No.: US 10,741,415 B2
(45) Date of Patent: Aug. 11, 2020

(54) THERMOSONICALLY BONDED CONNECTION FOR FLIP CHIP PACKAGES

(71) Applicant: STMICROELECTRONICS S.R.L., Agrate Brianza (IT)

(72) Inventors: Mauro Mazzola, Calvenzano (IT); Battista Vitali, Romano di Lombardia (IT); Matteo De Santa, Mezzago (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

(21) Appl. No.: 16/195,769

(22) Filed: Nov. 19, 2018

(65) Prior Publication Data

US 2019/0088503 A1 Mar. 21, 2019

Related U.S. Application Data

(62) Division of application No. 15/085,285, filed on Mar. 30, 2016, now Pat. No. 10,141,197.

(51) Int. Cl.
*H01L 23/495* (2006.01)
*H01L 23/48* (2006.01)
(Continued)

(52) U.S. Cl.
CPC ...... *H01L 21/4828* (2013.01); *H01L 21/4825* (2013.01); *H01L 21/4832* (2013.01); *H01L 21/4875* (2013.01); *H01L 21/56* (2013.01); *H01L 23/3107* (2013.01); *H01L 23/3171* (2013.01); *H01L 23/4822* (2013.01); *H01L 23/4924* (2013.01); *H01L 23/49582* (2013.01); *H01L 24/05* (2013.01); *H01L 24/10* (2013.01); *H01L 24/80* (2013.01); *H01L 24/97* (2013.01);
(Continued)

(58) Field of Classification Search
CPC ............ H01L 21/4828; H01L 21/4825; H01L 21/4875; H01L 21/56; H01L 23/3107; H01L 23/3171; H01L 23/4822; H01L 23/4924

See application file for complete search history.

(56) References Cited

U.S. PATENT DOCUMENTS 5,677,203 A * 10/1997 Rates ................. G01R 1/06711
438/15
5,686,352 A * 11/1997 Higgins, III ............ H01L 24/80
228/265

(Continued)

OTHER PUBLICATIONS

Denney et al., "TAB as a High Leadcount PGA Replacement," *IEEE Transactions on Components, Hybrids, and Manufacturing Technology* 14(3), Sep. 1991, 6 pages.

(Continued)

*Primary Examiner* — Brian Turner
(74) *Attorney, Agent, or Firm* — Seed IP Law Group LLP

(57) ABSTRACT

A method of making a package is disclosed. The method may include forming bond pads on a first surface of a substrate, forming leads in the substrate by etching recesses in a second surface of the substrate, the second surface being opposite the first surface, and plating at least a portion of a top surface of the leads with a layer of finish plating. The method may also include thermosonically bonding the leads to a die by thermosonically bonding the finish plating to the die and encapsulating the die and the leads in an encapsulant.

19 Claims, 8 Drawing Sheets

(51) Int. Cl.
*H01L 29/40* (2006.01)
*H01L 23/02* (2006.01)
*H01L 23/52* (2006.01)
*H01L 21/48* (2006.01)
*H01L 23/00* (2006.01)
*H01L 21/56* (2006.01)
*H01L 23/31* (2006.01)
*H01L 23/482* (2006.01)
*H01L 23/492* (2006.01)

(52) U.S. Cl.
CPC .......... *H01L 21/561* (2013.01); *H01L 24/08* (2013.01); *H01L 2224/04* (2013.01); *H01L 2224/05553* (2013.01); *H01L 2224/05554* (2013.01); *H01L 2224/05555* (2013.01); *H01L 2224/05567* (2013.01); *H01L 2224/08258* (2013.01); *H01L 2224/16245* (2013.01); *H01L 2224/80207* (2013.01); *H01L 2224/80439* (2013.01); *H01L 2224/80444* (2013.01); *H01L 2224/80455* (2013.01); *H01L 2224/97* (2013.01); *H01L 2924/00012* (2013.01); *H01L 2924/181* (2013.01)

(56) References Cited

U.S. PATENT DOCUMENTS

| | | | |
|---|---|---|---|
| 6,173,884 B1 * | 1/2001 | Urushima | B23K 20/106 228/180.5 |
| 2004/0150082 A1 | 8/2004 | Kajiwara et al. | |
| 2006/0014316 A1 | 1/2006 | Lin et al. | |
| 2007/0001277 A1 | 1/2007 | Ichikawa | |
| 2007/0052070 A1 | 3/2007 | Islam et al. | |
| 2007/0057271 A1 * | 3/2007 | Schiaffino | H01L 33/0095 257/99 |
| 2007/0141756 A1 | 6/2007 | Iitani et al. | |
| 2009/0032943 A1 * | 2/2009 | Shoji | H01L 21/4832 257/737 |
| 2009/0057858 A1 | 3/2009 | Ming Wang et al. | |
| 2010/0127377 A1 | 5/2010 | Bauer et al. | |
| 2010/0258934 A1 | 10/2010 | Chang Chien et al. | |
| 2011/0122590 A1 | 5/2011 | Wilson et al. | |
| 2011/0227208 A1 * | 9/2011 | Kim | H01L 21/4832 257/676 |
| 2011/0284993 A1 | 11/2011 | Kim | |
| 2012/0025375 A1 | 2/2012 | Lam | |
| 2012/0038036 A1 * | 2/2012 | Chun | H01L 21/4832 257/677 |
| 2012/0326288 A1 * | 12/2012 | Huang | H01L 23/49582 257/676 |
| 2013/0256864 A1 | 10/2013 | Nagano et al. | |
| 2013/0277815 A1 | 10/2013 | Lee et al. | |
| 2015/0001997 A1 | 1/2015 | Saito et al. | |

OTHER PUBLICATIONS

Gao et al., "Thermosonic Flip Chip Interconnection Using Electroplated Copper Column Arrays," *IEEE Transactions on Advanced Packaging* 29(4), Nov. 2006, 10 pages.

Otsuka et al., "Novel TAB Inner Lead Bonding Technology Eliminating Bump Formation Process," *42nd Electronic Components & Technology Conference*, San Diego, California, USA, May 18-20, 1992, 7 pages.

* cited by examiner

THERMOSONICALLY BONDED CONNECTION FOR FLIP CHIP PACKAGES

BACKGROUND

Technical Field

This disclosure generally relates to flip chip packages and more particularly to thermosonically bonded flip chip packages.

Description of the Related Art

Leadless (or no lead) packages are often utilized in applications in which small-sized packages are desired. In general, flat leadless packages provide a near chip scale encapsulated package formed from a planar lead frame attached to a semiconductor die. Leads located on a bottom surface of the package provide electrical connection between the semiconductor die and a substrate, such as a printed circuit board (PCB).

Typically, leadless packages include a semiconductor die or chip mounted to a die pad and electrically coupled to leads, such as by conductive wires. Improvements to make the packages thinner have eliminated the need for the die pad. In particular, chip-on-lead (COL) packages have the semiconductor die mounted directly on the leads without the die pad. The die and leads are encapsulated in an encapsulate to form the package.

Current applications for semiconductor packaging desire packages that have reduced thicknesses and a simplified connection between the die and the leads of the lead frame to reduce the volume of and increase the signal carrying ability of the package.

BRIEF SUMMARY

A method of making a package is disclosed. The method may include forming bond pads on a first surface of a substrate, forming leads in the substrate by etching recesses in a second surface of the substrate, the second surface being opposite the first surface, and plating at least a portion of a top surface of the leads with a layer of finish plating. The method may also include thermosonically bonding the leads to a die by thermosonically bonding the finish plating to the die and encapsulating the die and the leads in an encapsulant.

A semiconductor package is disclosed. The semiconductor package may include a semiconductor die having an active surface, leads having first and second opposing ends, and a finish plating on the first ends of the leads. The leads may be thermosonically coupled to the semiconductor die via the finish plating. The package may also include an encapsulant that encapsulates the die and the leads and exposes the second ends of the leads.

A method of forming chip scale packages is disclosed. The method may include forming bond pads on a first surface of a substrate and forming leads in the substrate by etching recess in a second surface of the substrate with the second surface of the substrate being opposite the first surface. The method may also include thermosonically bonding the leads to a die and encapsulating the die and the leads in an encapsulant.

DETAILED DESCRIPTION

Figure 1A:
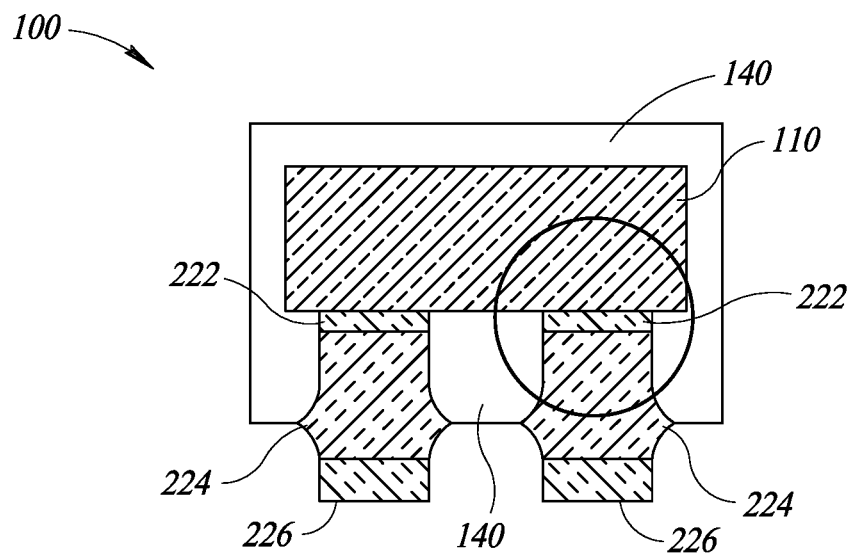
FIG. 1A is a schematic illustration of a cross section of a flip chip package structure according to one or more embodiments of the present disclosure.
Figure 1B:
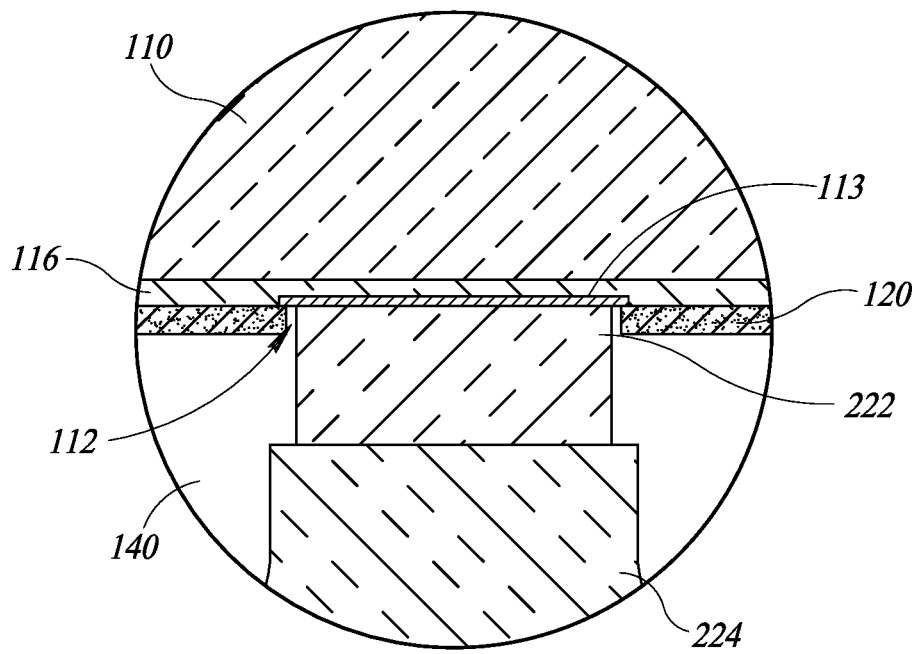
FIG. 1B shows a detailed view of the schematic illustration of the cross section of the flip chip package structure of FIG. 1A.

FIGS. 1A and 1B show an embodiment of a quad flat no lead (QFN) semi-conductor package 100. The package 100 includes an encapsulant 140 that surrounds leads 224 and a die 110. FIG. 1A shows the overall structure of the package 100, while FIG. 1B shows a close up view of the connection between the leads 224 and the die 110.

The die 110 may be manufactured according to standard semiconductor manufacturing processes, and may be made of silicon or other semiconductor material. The die 110 includes an active surface 116 in which integrated circuits are formed. The integrated circuits may be analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 116 to implement analog circuits or digital circuits, such as a digital signal processor (DSP), ASIC, MEMS, memory, or other signal processing circuit. The die 110 may also contain integrated passive devices (IPD), such as inductors, capacitors, and resistors, for RF signal processing.

In some embodiments, the die 110 includes a passivation layer 120 that aids in protecting the active surface 116 and the die 110 from electrical and physical damage and contamination. The passivation layer is an insulative material, such as metal oxide, and is generally very thin, on the order of 1 to 3 microns. In some embodiments, the passivation layer may be a photosensitive insulator permanent layer. The photosensitive insulator materials on the die pad may be polybenzobisoxazole (PBO) or polyimide materials and have a thickness of up to 10 um or more.

The passivation layer 120 includes openings 112 that expose bond pads 113 on the active surface 116 of the die 110. The bond pads 113 of the die 110 are coupled to the leads 224.

Each lead 224 provides an electrical and physical coupling between the die 110 and an environment outside of the package 100. Each lead 224 includes a contact pad 226 for connecting the package to another device or a substrate, such as a printed circuit board, for communication with devices external to the package 100.

Each lead 224 includes a finish plating layer 222. The finish plating layer 222 provides an interface between the die and the leads 224. The finish plating layer 222 may include one or more layers of nickel, silver, or gold deposited via an electroplating process. The electroplating process allows the finish plating layer 222 to be laid down in a very thin layer; for example, the plating layer may have a thickness that substantially corresponds to the thickness of the passivation layer 120 or may be thicker than the passivation layer. Although not shown, a patterned mask may be deposited on the second surface 232 prior to forming the finish plating layer 222 to control the application of the finish plating layer 222, as is well known in the art. After the finish plating layer 222 is formed, the patterned mask layer is removed from the second side 232 of the substrate 220.

The thickness of the finish plating layer 222 may be between 5 microns and 25 microns. In some embodiments, the finish plating layer may have a thickness of as little as 1 micron. In some further embodiments, the finish plating layer may be as much as 60 microns in thickness. In still other embodiments, the finish plating layer may be less than 1 micron in thickness.

The plating process also allows the finish plating layer 222 to be formed in various shapes, as described below with reference to FIGS. 5A and 5B; for example, the shape of finish plating layer 222 may substantially correspond to the shape of the opening 112 in the passivation layer 120. In particular, the plating process allows for forming the finish plating layer 222 with tight tolerances, such as on the order of 1 micron. These tolerances are smaller than the tolerances available through other deposition and etching processes that may be used, for example, to form the leads 224. In some embodiments, the size finish plating layer 222 corresponds to the size of the lead 224, which is smaller than the size of the opening in the passivation layer. In that regard, a gap is not produced between the end of the lead 224 and the bond pad 113.

The finish plating layer 222 also aids in reducing the overall height of the package 100 and the length of the leads 224, particularly as compared to a typical stud bump connection process, which typically involves conductive bumps coupling the die to the leads in a flip chip configuration. Stud bumps formed at the top of a lead via a wire bonding process have a thickness of at least 25 to 30 microns, while a finish plating, applied via a plating process, has a thickness as small as 2.5 microns. By reducing the length of the leads and their connection to the die, the performance of the package 100 may be increased; for example, the shorter lead length may allow the die 110 to communicate with other components of an electronic device at a higher frequency, which leads to higher data transfer rates.

The package 100 further includes an encapsulant 140 that encapsulates the die 110, the finishing plating layer 222, and portions of the leads 224. The die 110 and the leads 224 are held in their respective positions within the package 100 by the encapsulant 140. The encapsulant 140 is an insulative material that protects the electrical components and materials from damage, such as corrosion, physical damage, moisture damage, or other causes of damage to electrical devices and materials. In one embodiment, the encapsulant 140 may be any suitable mold compound, such as but not limited to epoxy resin, phenolic resin, polymer, or polyester resin. The base portions of the terminal leads 224 and the contact pads 226 are left exposed from the encapsulant 140.

The leads 224 are electrically and mechanically coupled to the die 110 via a thermosonic bonding process that bonds the finish plating layer 222 to the active surface 116 of the die 110. The thermosonic bonding process uses heat, friction, and sonic vibrations to soften the finish plating layer 222 and bond it to the active surface 116 of the die 110. The thermosonic bonding process also produces an upper surface of the finish plating layer 222 that is substantially planar and more uniform than, for example, a stud bump bonding process. The substantially planar and uniform shape of the upper surface of the finish plating layer 222 formed though the electroplating process increases the strength of mechanical connection between the lead 224 and the die 110, particularly as comparted to the stud bump connection process.

Using a finish plating layer 222 thermosonically bonded to a die 110 may also allow for the use of different types of encapsulants, such as more readily available and less expensive molding compounds as compared to, for example, a package that includes a stud bump connection between the lead 224 and the die 110. Typically, stud bump connections leave narrow gaps between the top of a lead and the active surface of a die. In general, the gap is formed because the bumps are much smaller than the size of the upper surface of the lead 224. During assembly, resin or molding compound are used that can adequately flow to fill in the gaps between the top of the leads and the die and around the stud bump so that the die can be adequately supported by the encapsulant. Conversely, the finish plating layer 222 of the present disclosure are more aligned with the size and shape of the leads 224 and allow for close tolerances and accurate plating shapes, such that the gap may be reduced or eliminated. Thus, different types of resins may be used, such as more readily available and common resins and molding compounds.

Figure 2A:
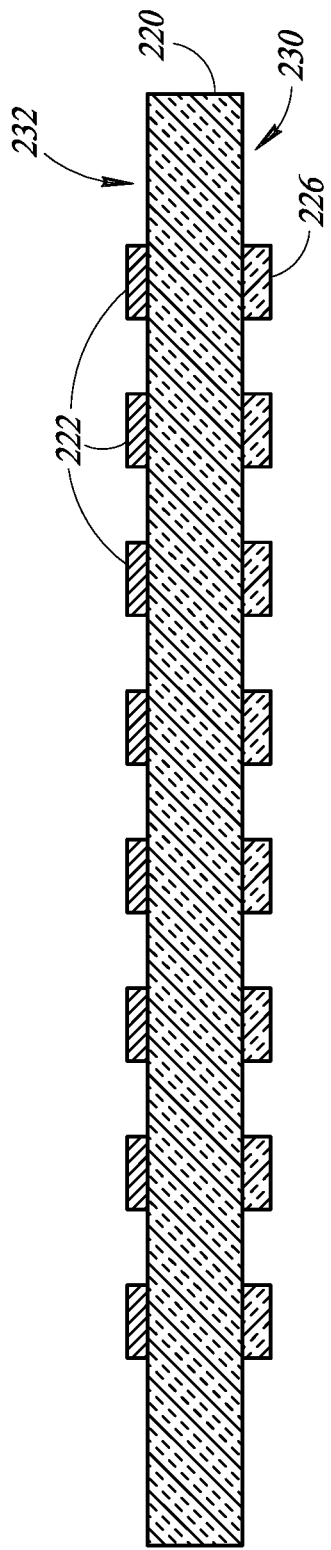
FIGS. 2A-2B are schematic cross sections of the conductive substrate formed into a lead frame strip at various stages in a manufacturing process according to one or more embodiments of the present disclosure.
Figure 2B:
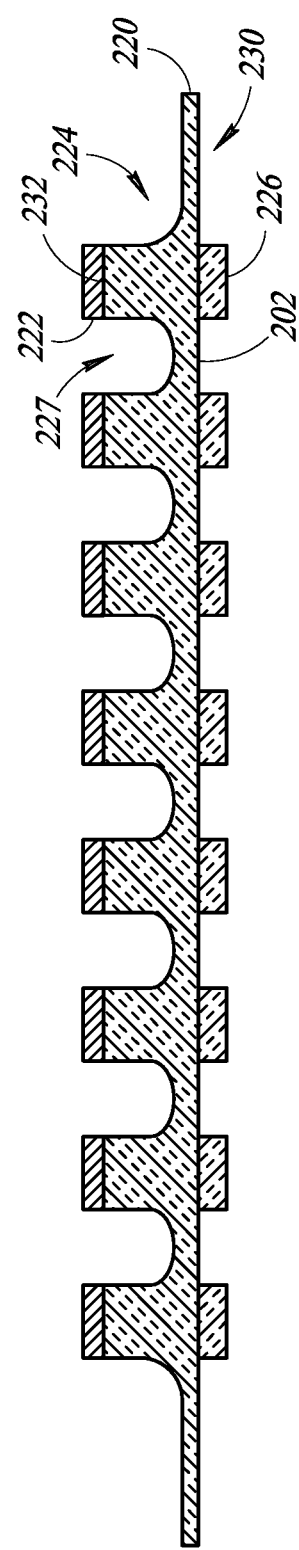

FIGS. 2A-2B show one embodiment of a method of forming a lead frame having leads that include a finish plating layer. As shown in FIG. 2A, a conductive substrate 220 is provided as the base material for the lead frame. In some embodiments, the substrate 220 may be a metal material, such as copper or a copper alloy. As shown in FIG. 2A, contact pads 226 may be formed on a first surface 230 of the substrate 220. A deposition process, such as plating, is carried out on the bottom side 230 of the copper substrate 220 with a bondable metal material, such as Ni, Ag, Ni/Pd, Ni/Pd/Ag, Ni/Pd/Au—Ag alloy, or Ni/Pd/Au/Ag, or any bondable conductive material, to form contact pads 226. Although not shown, a patterned mask layer of light sensitive material may be deposited on the first surface 230 prior to forming the contact pads 226 as is well known in the art. After the contact pads 226 are formed, the patterned mask layer is removed from the first side 230 of the substrate 220.

As shown in FIG. 2A, the top surfaces of the leads 224 are electroplated with a finish plating layer 222. The finish plating layer 222 is a thin layer of plated metal that aids in bonding the copper of the substrate 220 to the die 110 via the thermosonic bonding process. The finish plating layer 222 may be an electrical and thermal conductor, such as silver, gold, or nickel. In some embodiments, the finish plating layer 222 may include multiple electroplated layers. For example, a first layer of nickel followed by a second, top layer of gold or silver.

The thickness of the finish plating layer 222 may correspond to the thickness of the passivation layer 120 of the die 110, to which the final lead frame will be attached. By forming a finish plating layer 222 with a thickness that corresponds to the thickness of the passivation layer 120, the length of the leads 224 are minimized, thereby increasing the electrical properties of the lead; for example, transmitting signals at higher quality and at higher frequencies than would be acceptable with a longer lead 224.

In addition, the use of precious metals such as silver and gold have a significant impact on the overall cost of manufacturing a package such as the package 110. The precision application of the finish plating layer 222 allows a manufacturer to minimize the amount of silver and gold used to connect the lead 224 to the die 110. For example, although the upper surface 232 of the lead 224 may have a relatively large surface area, the finish plating layer 222 may be applied to less than the entire upper surface of the lead 224. For example, the finish plating layer 222 may be formed on the lead 224 in a size and shape that substantially corresponds to the size and shape of the opening 112 in the passivation layer 120 of the die 110 to which the lead 224 will be attached. It is to be appreciated, however, that the finish plating layer 222 is slightly less than the size of the opening 112 in the passivation layer 120 so that the finishing plating layer 222 fits within the openings 112. Furthermore, by substantially corresponding the thickness of the finish plating layer 222 to the thickness of the passivation layer 120 such that the upper surface of the lead 224 does not interfere with the passivation layer 120, the amount of material used in the finish plating layer 222, such as gold or silver, may be minimized.

As shown in FIG. 2B, an etching process is performed to etch the exposed portion of the substrate 220 from the second side 232. The etch may be a half etch or may etch more than half way through the substrate 220. During the etching process, recesses 227 are formed in the second surface of the substrate 220 to form the leads 224 and webbings 202 between the leads 224. During the etching process, a patterned mask, such as a photoresist film, may be applied to the second side 232 of the substrate 220 to expose portions of the surface of the substrate 220 for etching and to cover portions of the substrate 220 that are not etched. Alternatively, the finish plating layer 222 can act as an etching mask for forming the recesses 227. After the substrate 220 is etched, the photoresist film, if used, is removed from the second side 232 of the substrate 220, and the remaining portions of the second side 232 now form a top surface of each of the leads 224.

Although not shown, in another embodiment, the finish plating layer 222 may be blanket deposited on the entire second side 232 of the substrate 220 and then patterned. The finish plating layer 222 is etched and the substrate 220 are etched in one or more etching steps to form the channels 227 in the finish plating layer and the substrate 220 to form individual leads 224, topped with a finish plating layer 222.

Figure 3A:
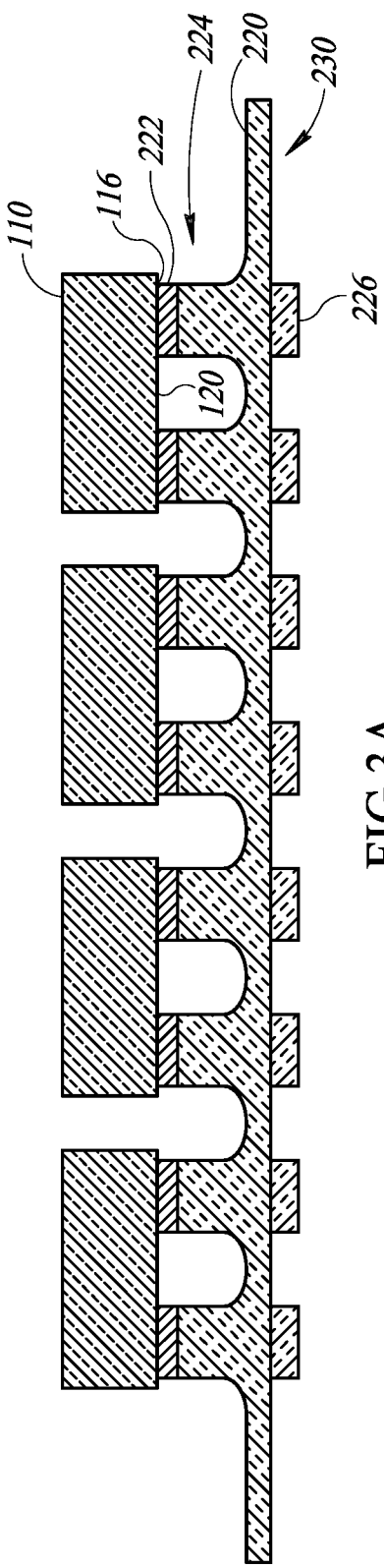
FIGS. 3A-3E are schematic cross sections of various stages of assembly of a flip chip package, such as the flip chip package of FIG. 1A.

As shown in FIG. 3A a plurality of die 110 are coupled to the leads 224. In particular, the die 110 are attached to the leads 224 via a thermosonic bonding process wherein the finish plating layer 222 is pressed against the active surface 116 of the die 110, though the openings in the passivation layer 120, and subjected to heat and sonic vibrations to soften and bond the finish plating layer 222 to the bond pads of the die 110.

Figure 3B:
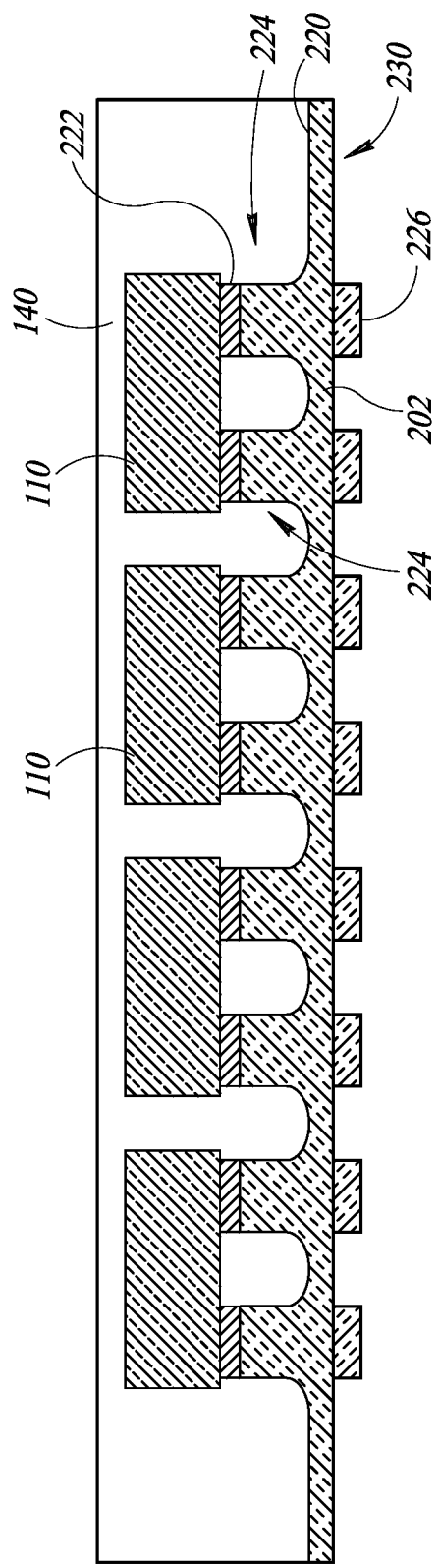

FIG. 3B depicts the encapsulation process, wherein the die 110 and the terminal leads 224 are surrounded by and held in their respective positions by the encapsulant 140. As mentioned above, encapsulant 140 is a mold compound. The assembly of the substrate 220 and die 110 is placed in a mold and resin flows around and between the various dies 110 and their respective leads 224 to fill open spaces, thereby providing structural support to the dies and leads from the external environment. As mentioned above, the size and shape of the finishing plating layer 222 significantly corresponds to the size and shape of the end of the lead 224. Thus, mold compound or resin does not have to flow between a gap between the end of the leads and the bond pads.

As shown in FIG. 3B, the first surface 230 of the substrate 220 is left exposed by the molding compound. The encapsulant 140 is then hardened, which may involve a heating or curing step.

Up until this point in the manufacturing process the substrate 220 and its bond with the die 110 and, in particular, the webbing 202 between the etched leads 224 of the substrate 220, have maintained the relative position and structural stability of the components. After the encapsulant 140 has hardened, the encapsulant 140 provides the additional structural support to maintain the relative position and structural stability of the various components, including the dies 110 and the leads 224.

Figure 3C:
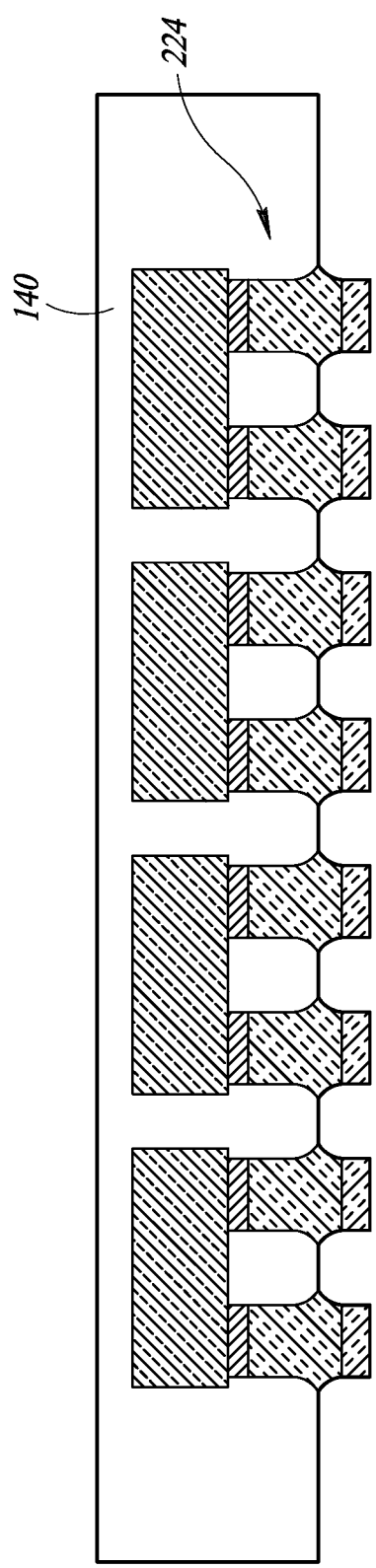

As shown in FIG. 3C, the webbing 202 between the leads and any other extraneous portions of the substrate 220 are removed. The webbing 202 and other extraneous portions of the substrate 220 may be removed via etching, for example as described above with respect to etching the top portion of the substrate 220. In some embodiments, the contact pads 226 act as an etching mask for etching the webbing 202. Upon completion of the etch step, the leads are electrically isolated from each other.

Figure 3D:
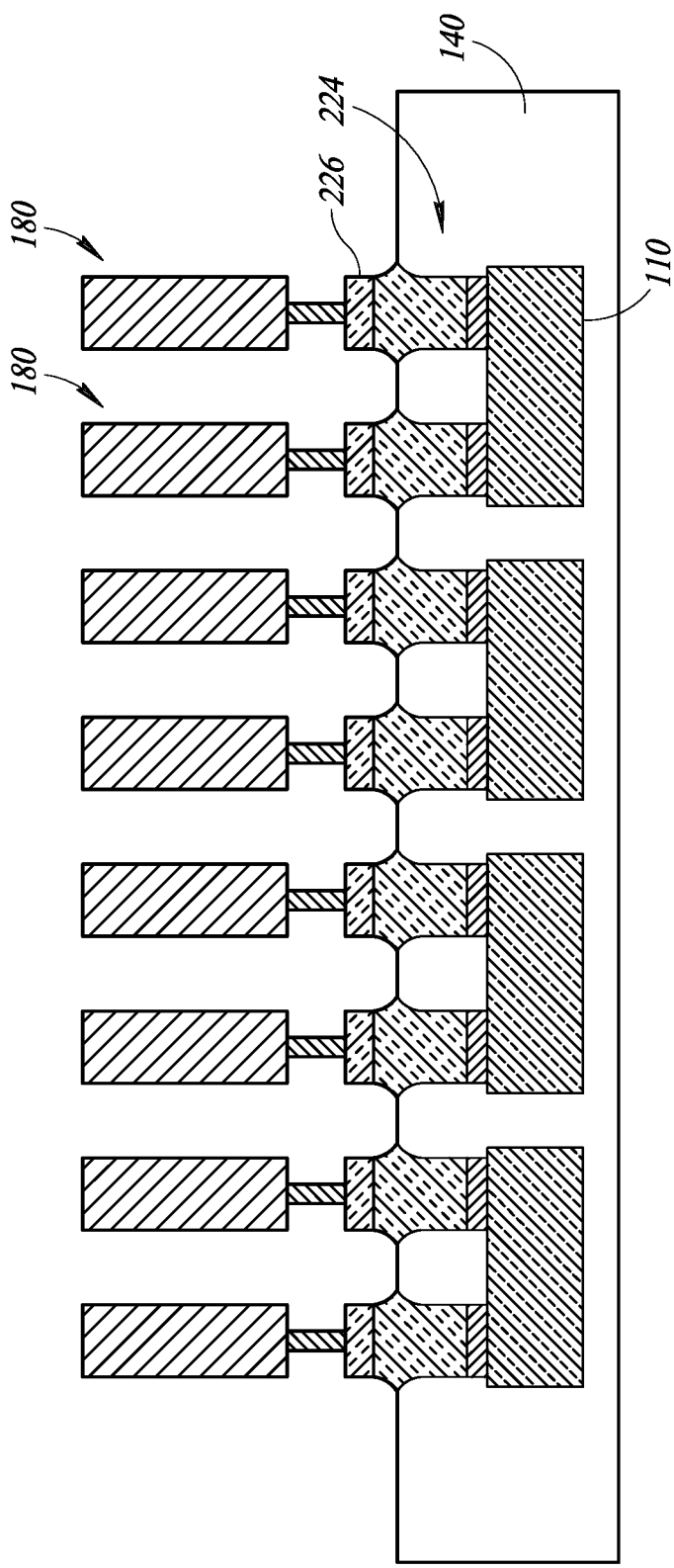

After the leads 224 are electrically isolated from each other, electrical testing may be performed on the leads and dies to check for defects as is schematically shown in FIG. 3D. The process is carried out by applying probes 180 to each of the contact pads 226 and conducting various diagnostic checks, as is known in the art.

Figure 3E:
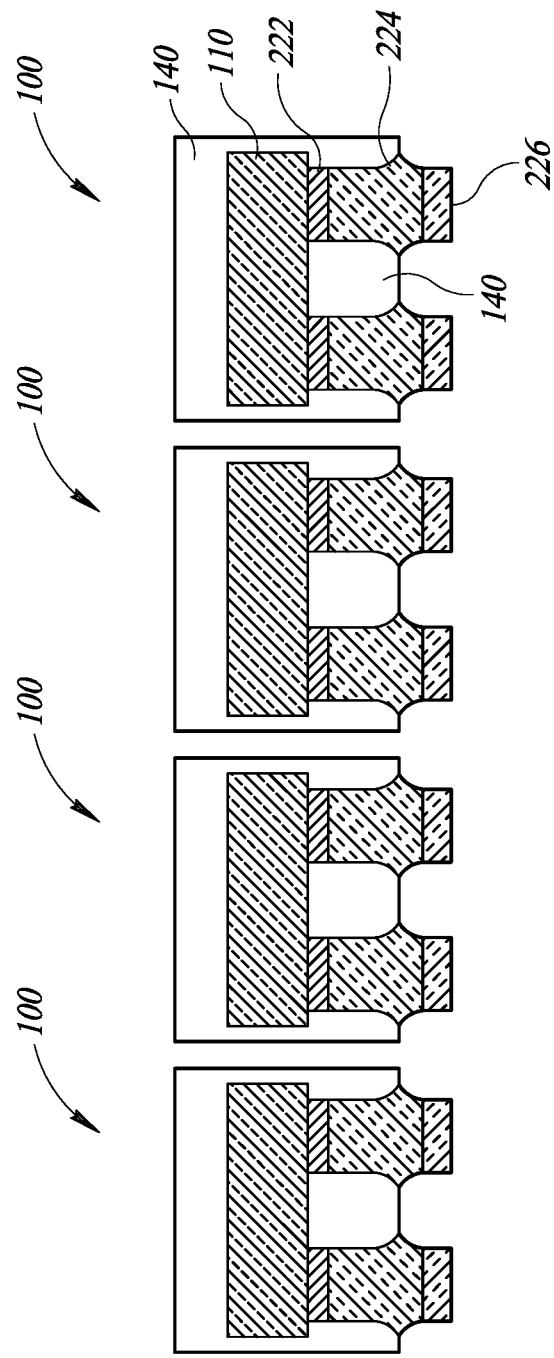

In FIG. 3E, a dicing step is performed. The dicing process may include any suitable dicing process to separate the individual packages, such as mechanical sawing, whereby a dicing saw is used to cut the packages 100 along a line, or may include laser cutting, whereby a laser is used to separate the packages 100 along a line and into individual packages 100.

Figure 4A:
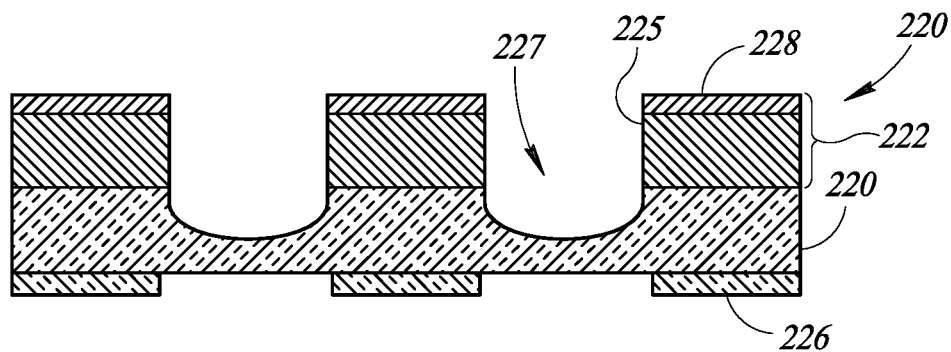
FIG. 4A is schematic cross section of a lead frame according to one or more embodiments of the present disclosure.
Figure 4B:
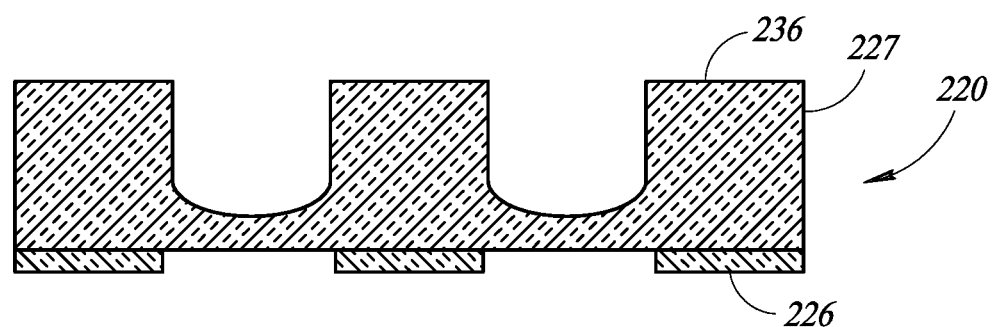
FIG. 4B is schematic cross section of a lead frame according to one or more embodiments of the present disclosure.

FIGS. 4A and 4B show two embodiments of lead frame structures. In FIG. 4A, the finish plating layer 222 includes a first plating layer 225, which may be nickel, and a second plating layer 228, which may be silver, or gold. The electrical and mechanical bond between the lead 224 and plating layer 222 may be improved by forming a finish plating layer 222 with two layers of conductive material. For example, nickel may have a greater ability to bond with gold and copper, than gold's ability to bond directly with copper. Thus, a first plating layer 225 of nickel located between the second plating layer 228 and lead may provide increased bonding between, for example, the copper of the lead 224 and the gold or silver second plating layers 226 as compared to directly plating the gold or silver on the copper leads.

In FIG. 4B, the substrate 220 includes integral leads 227 without a finish plating layer applied to the upper surfaces 236 of the integral leads 227. In such embodiments, the finish plating process may be omitted from the manufacturing process of the package 100 and the substrate material may be thermosonically bonded directly to the die 110. For example, if the substrate 220 is made from copper sheet, then the copper leads formed from the copper sheet may be thermosonically bonded directly to the die.

Figure 5A:
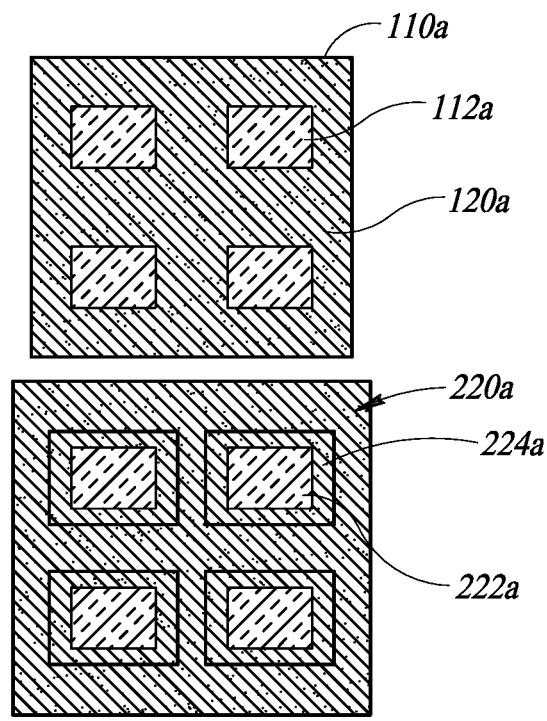
FIG. 5A is a schematic view of a top side of a lead frame and a bottom side of a die according to one or more embodiments of the present disclosure.
Figure 5B:
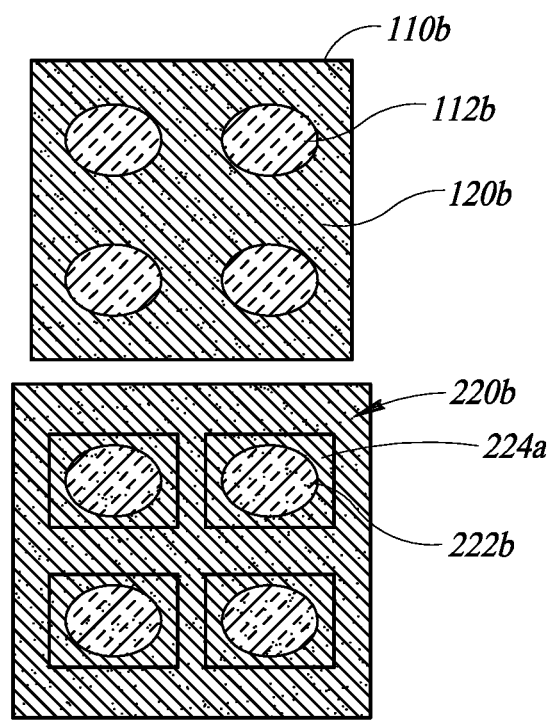
FIG. 5B is a schematic view of a top side of a lead frame and a bottom side of a die according to one or more embodiments of the present disclosure.

FIGS. 5A and 5B depict two embodiments of finish plating layers formed with a size and shape that corresponds to a size and shape of an opening within the passivation layer, which may also be in the shape of the bond pads of the die. In FIG. 5A, the openings 112a in the passivation layer 120a of the die 110a have a rectangular shape, such as a square. The corresponding finish plating layers 222a atop each of the leads 224a of the substrate 220a have a size and shape that corresponds to the size and shape of the openings 112a in the passivation layer 120a. In some embodiments, the dimensions of the corresponding openings 112a, and finish plating layer 222a, may be substantially similar to each other, and in some embodiments, the dimensions of the corresponding openings 112a may be larger than the dimensions of the finish plating layer 222a.

FIG. 5B shows the openings 112b of the passivation layer 120b of the die 110b having a round shape, such as a circle, oval, or annular shape. The corresponding finish plating layers 222b atop each of the leads 224b of the substrate 220b have a size and shape that corresponds to the size and shape of the openings 112b in the passivation layer 120b. In some embodiments, the dimensions of the corresponding openings 112b, and finish plating layer 222b, may be substantially similar to each other, and in some embodiments, the dimensions of the corresponding openings 112b may be larger than the dimensions of the finish plating layer 222b.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor package comprising:
a semiconductor die having an active surface;
a passivation layer on the active surface of the semiconductor die, the passivation layer having openings that expose portions of the active surface, a first opening of the openings exposing a part of a discrete connection pad embedded in the active surface, a surface of the discrete connection pad being exposed from the first opening and substantially at a same level as the active surface;
leads having first and second opposing ends, each lead extending from the die in a first direction, the first and second opposing ends being aligned with each other in the first direction;
a plating layer on the first ends of the leads, the leads being coupled directly to the semiconductor die by the plating layer through the openings in the passivation layer; and
an encapsulant that encapsulates the die and the leads and exposes the second ends of the leads, the encapsulant having a surface that is positioned between the first end and the second end of the leads.

2. The semiconductor package of claim 1, wherein the openings in the passivation layer have a first shape and the plating layer has a second shape that corresponds to the first shape.

3. The semiconductor package of claim 2, wherein the plating layer is smaller in size than the openings in the passivation layer.

4. The semiconductor package of claim 1, wherein the openings in the passivation layer have a first thickness and the plating layer has a second thickness that corresponds to the first thickness.

5. The semiconductor package of claim 4, wherein the first thickness is less than the second thickness.

6. The semiconductor package of claim 1, wherein the plating layer on the first ends of the leads fully covers the first ends of the leads.

7. A device, comprising:
a semiconductor die;
a passivation layer on a surface of the semiconductor die, the passivation layer having a plurality of openings;
a plurality of bond pads embedded under the surface of the semiconductor die, each bond pad being aligned with and being at least partially exposed from one of the plurality of openings, and each bond pad having a surface buried below the surface of the semiconductor die;
a plurality of leads, each lead of the plurality of leads having a first end that has a first width and a second end that is opposite and aligned with the first end, each lead having a length that extends between the first end and the second end, each lead having a second width that is greater than the first width, the second width being between the first end and the second end; and
a plating layer on the first end of each lead, the plating layer having a third width that is less than the first width, the plating layer being bonded directly to a bond pad of the plurality of bond pads.

8. The device of claim 7, further comprising an encapsulant that encapsulates the semiconductor die and at least a portion of individual leads of the plurality of leads.

9. The device of claim 7, wherein the plurality of openings in the passivation layer have a fourth width that is substantially the same as the third width.

10. The device of claim 7, wherein the plating layer includes:
a first plating sublayer; and
a second plating sublayer on the first plating sublayer.

11. The device of claim 10, wherein the first plating sublayer is nickel or an alloy thereof.

12. The device of claim 10, wherein the second plating sublayer is silver or gold.

13. A device, comprising:
a semiconductor die;
a bond pad embedded in the semiconductor die, a first surface of the bond pad buried within the semiconductor die;
a passivation layer on the semiconductor die, the passivation layer having a first thickness and an opening that exposes a portion of a second surface of the bond pad, the second surface opposite to the first surface and substantially at a same level as a surface of the semiconductor die that surrounds the bond pad;
a lead having a first end that is aligned with and positioned opposite to a second end, the lead having a first width at the first end and a second width at a location between the first end and the second end, the second width being greater than the first width; and
a plating layer on the first end of the lead, the plating layer being thermosonically bonded directly to the portion of the bond pad of the semiconductor die in the opening.

14. The device of claim 13, further comprising an encapsulant that encapsulates at least a portion of the semiconductor die and at least a portion of the lead.

15. The device of claim 13, wherein the plating layer and the passivation layer have a thickness between 1 micron and 10 microns.

16. The device of claim 13, wherein a width of the plating is less than the first width of the lead.

17. The device of claim 13, wherein the plating layer includes one or more layers of: at least one of nickel, silver, or gold.

18. The device of claim 13, wherein a size and shape of the plating layer corresponds to a size and shape of the bond pad.

19. The device of claim 13, wherein the plating layer covers an entire surface of the first end of the lead.

* * * * *